United States Patent [19]
Biebl

[11] Patent Number: 5,939,171
[45] Date of Patent: Aug. 17, 1999

[54] MICROMECHANICAL COMPONENT

[75] Inventor: Markus Biebl, Augsburg, Germany

[73] Assignee: Siemens Aktiengesellschaft, Munich, Germany

[21] Appl. No.: 08/875,371

[22] PCT Filed: Jan. 2, 1996

[86] PCT No.: PCT/DE96/00004

§ 371 Date: Jul. 24, 1997

§ 102(e) Date: Jul. 24, 1997

[87] PCT Pub. No.: WO96/23230

PCT Pub. Date: Aug. 1, 1996

[30] Foreign Application Priority Data

Jan. 24, 1995 [DE] Germany ............................ 195 02 115

[51] Int. Cl.$^6$ .......................... H01L 21/00; G01P 15/125
[52] U.S. Cl. .................... 428/141; 438/52; 216/2; 216/11; 428/156; 428/901; 428/131; 73/514.32
[58] Field of Search ..................... 428/141, 901, 428/156, 131; 216/2, 11; 73/514.31; 438/52

[56] References Cited

U.S. PATENT DOCUMENTS

| | | | |
|---|---|---|---|
| 4,999,735 | 3/1991 | Wilner | 73/718 |
| 5,258,097 | 11/1993 | Mastrangelo | 156/644 |
| 5,313,536 | 5/1994 | Fujii et al. | 73/514 |
| 5,326,726 | 7/1994 | Tsang et al. | 437/228 |
| 5,447,600 | 9/1995 | Webb | 216/2 |
| 5,662,771 | 9/1997 | Stouppe | 438/52 |
| 5,679,436 | 10/1997 | Zhao | 428/141 |
| 5,750,420 | 5/1998 | Bono et al. | 438/52 |
| 5,772,902 | 6/1998 | Reed et al. | 216/2 |

FOREIGN PATENT DOCUMENTS

| | | |
|---|---|---|
| 0 605 300 A1 | 6/1994 | European Pat. Off. . |
| 43 38 423 A1 | 5/1994 | Germany . |
| 43 15 012 A1 | 10/1994 | Germany . |
| 5332843 | 4/1995 | Germany . |
| 4-286165 | 10/1992 | Japan . |
| 96/01483 | 1/1996 | WIPO . |

*Primary Examiner*—William P. Watkins, III
*Attorney, Agent, or Firm*—Hill & Simpson

[57] ABSTRACT

Micromechanical component, wherein there are present, between a movable part (2) and a substrate (1), narrowly bounded spikes or spacers (3) which are composed of dielectric and which prevent the movable part from adhering (sticking) to the opposite surface during production and while the component is being operated during deflection in the direction of the substrate. Said spikes are produced by etching an auxiliary layer between the substrate and the structural layer (2) through etching apertures (4) to such an extent that only the layer components (3) forming such spikes are left behind.

19 Claims, 3 Drawing Sheets

MICROMECHANICAL COMPONENT

BACKGROUND OF THE INVENTION

1. Field of the Invention

The present invention is directed towards the production and operation of micromechanical structures such as sensors having a layered structure. More specifically, the present invention is directed towards micromechanical components having a layered structure wherein adjacent layers have a tendency to stick or adhere to one another.

2. Description of the Prior Art

A basic problem in the production and especially in the operation of micromechanical structures is the sticking of the movable parts to oppositely situated surfaces in the case of large deflections. Very strong, short-range intermolecular forces such as the Van-der-Waals force and hydrogen-bridge bonds result therefore an inseparable joint between the deflected micromechanical structure and the oppositely situated surface, making the component unusable. This problem occurs, in particular, in the case of very sensitive acceleration sensors which have a correspondingly pliantly suspended material part and in which adherence of the micromechanical structure to the fixed part may arise during the occurrence of accelerations. In addition, the problem occurs that a short circuit may arise between a movable part used as electrode and an electrode disposed opposite said part, which also leads to the destruction of the component.

Methods have been developed for the production of micromechanical structures which avoid the adherence of moving structures. Said methods do not, however, solve the problem that said adherence may occur even after production, that is to say during the operation of the component. In order to avoid sticking during the operation, a number of small raised sections directed toward the oppositely situated surface can be produced in the layer structure in which the moving micromechanical part is formed. The contact area is consequently kept very small in the case of a collision between the oppositely situated surfaces. In order to produce said structure, an additional photographic procedure and an isotropic and (additional) etching step is required. In these method steps, recesses are produced in a sacrificial layer (i.e, an auxiliary layer to be removed subsequently). The structural layer is then deposited conformally onto this sacrificial layer, so that the recesses in the sacrificial layer remain as raised sections of the structural layer when the sacrificial layer is removed. This method is shown in FIGS. 2 to 5. FIG. 2 shows an intermediate product of the component in cross section, in which a sacrificial layer 11 and, on top thereof, a mask 12 having an opening 13 are applied to a substrate 10 in the region of the recess to be produced. FIG. 3 shows how a recess is etched in the sacrificial layer 11 through the opening 13. After the removal of the mask 12, the structural layer 20 provided for the movable part is applied with a uniform thickness (see FIG. 4). After the removal of the auxiliary layer 11, the structure shown in FIG. 5 is obtained, in which structure the structural layer 20 has a raised section on the side adjacent to the substrate 10. The structural layer 20 can be patterned according to the sensor to be produced. This method does not make it possible to produce raised sections on the structural layer which are sufficiently high and pointed. The dimensions of the elevations are in fact limited in the downward direction by the resolving power of the photographic procedure used in the process and the subsequent wet-chemical etching, so that narrow spikes cannot be produced. For extremely miniaturized micromechanical components, this method of avoiding sticking is therefore usable only to a very limited extent. The disadvantage is that an electrically conducting contact occurs between the faces in the case of contact between the movable part and the substrate surface and if electrodes are provided the electrically conducting contact is also not thereby eliminated.

SUMMARY OF THE INVENTION

The object of the present invention is to provide a micromechanical component and an associated production method in which the problem of adherence (sticking) is avoided during production and during operation which comprises a substrate and a moveable part disposed a spaced distance from the substrate. The moveable part includes at least two apertures that extend through the movable part. The component further comprises a spacer that is disposed either on a surface of the substrate or a surface of the movable part and laterally between the apertures of the movable part. The spacer is sufficiently small so that it does not prevent movement of the movable part towards the substrate but sufficiently large enough to prevent contact between the movable part and to the substrate.

In an embodiment, the spacer is conically shaped.

In an embodiment, the spacer has a shape of a pyramid.

In an embodiment, the spacer is fabricated from a dielectric material thereby permitting the substrate surface and the movable part surface to be fabricated from dielectrically conductive materials.

In an embodiment, the substrate and the movable part comprise layers of a sensor.

In an embodiment, the component comprises a plurality of spacers whereby each spacer is disposed between at least two apertures in the movable part. A pattern of apertures may be provided in the movable part and a similar but offset, pattern of spacers may be provided on the substrate. The spacers and apertures are arranged so that the spacers are centrally or equidistantly disposed between three, four, five or more apertures in the movable part.

The present invention also provides a method of manufacturing a micromechanical component which includes the steps of providing a substrate, depositing an auxiliary layer on top of the substrate, depositing a structural layer with a plurality of apertures on top of the auxiliary layer and selectively removing most of the auxiliary layer through the apertures of the structural layer until small spacers are formed from the remaining portions of the auxiliary layer, the spacers being disposed between at least two apertures, depending upon the geometric pattern of apertures disposed in the structural layer.

In an embodiment, the patterned mask is deposited on top of the auxiliary layer, the mask having a plurality of gaps. The structural layer is deposited through the gaps in the mask. The mask is subsequently removed to define the plurality of apertures in the structural layer.

In an embodiment, the materials of the structural layer and auxiliary layer are chosen so that the auxiliary layer may be selectively etched using the apertures in the structural layer as etching apertures.

BRIEF DESCRIPTION OF THE DRAWINGS

The invention will be described more or less diagrammatically in the following figures wherein.

It should be understood that the drawings are not necessarily to scale and that the embodiments are sometimes illustrated by graphic symbols, phantom lines, diagrammatic representations, and fragmatary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

Figure 1:
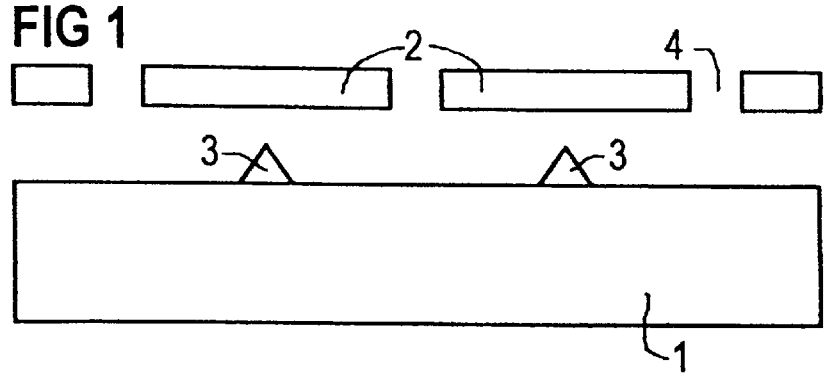
FIG. 1 is a side view of a microcomponent made in accordance with the present invention.
Figure 2:
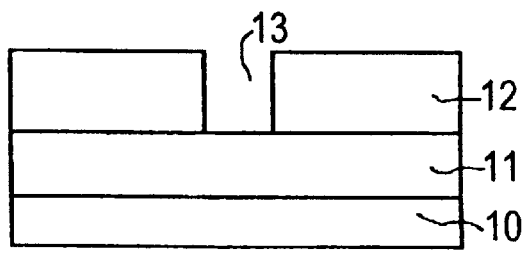
FIG. 2 is a side view of an intermediate product of a prior art process used to manufacture micromechanical components.
Figure 3:
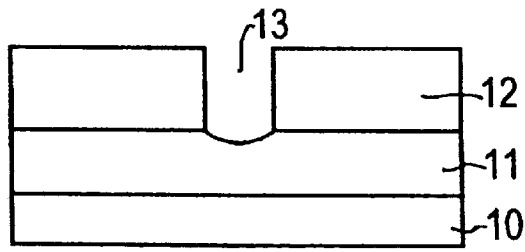
FIG. 3 is a side view of another intermediate product of the prior art process first illustrated in FIG. 2.
Figure 4:
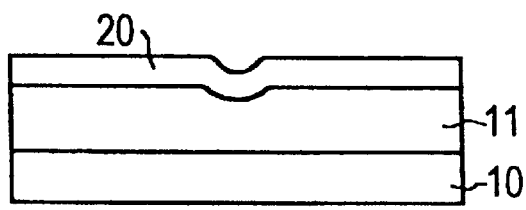
FIG. 4 is a side view of another intermediate product of the prior art process first illustrated in FIG. 2.
Figure 5:
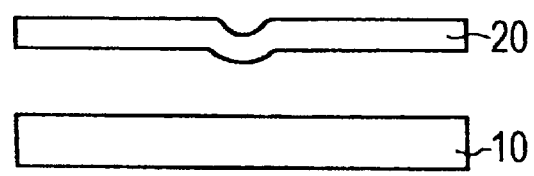
FIG. 5 is a side view a of a micromechanical component manufactured in accordance with the prior art process illustrated in FIGS. 2–4.

A component according to the invention is shown in cross section in FIG. 1.

FIGS. 6 to 9 show cross sections of intermediate products of a component according to the invention in accordance with various steps in the production method.

Figure 10:
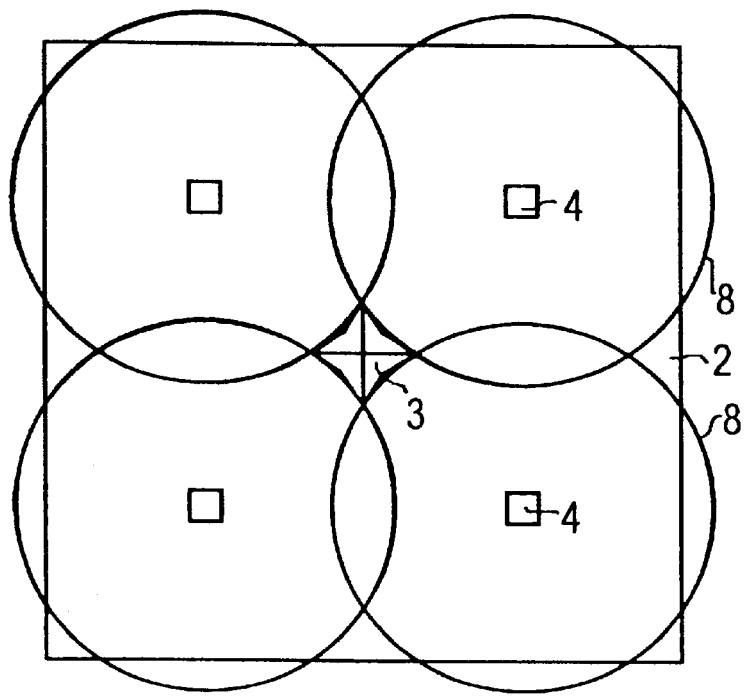
FIG. 10 is a plan view of a micromechanical component made in accordance with the present invention.
Figure 11:
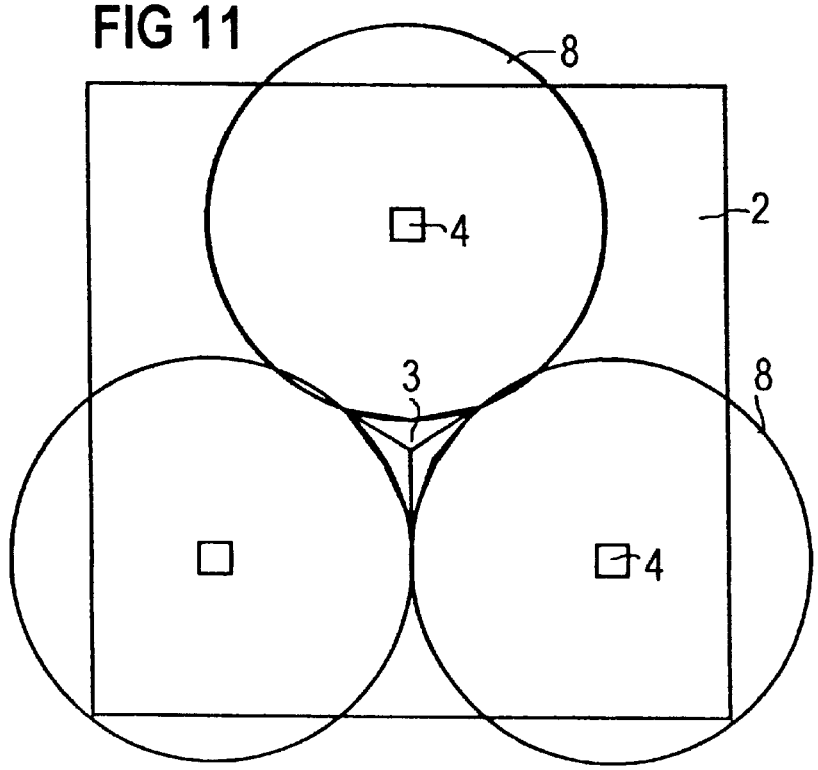
FIG. 11 is a plan view of another micromechanical component made in accordance with the present invention.

FIGS. 10 and 11 show components according to the invention in plan view for the purpose of explaining the production method.

In the component according to the invention, as is shown by way of example in FIG. 1, there are disposed between a movable part (a micromechanical structure) and an oppositely situated fixed surface with respect to the chip on which the component is disposed at least one spike, preferably made of an electrically insulating material which prevents as a spacer the movable part from being able to contact the oppositely situated surface. As an example, there is anchored on a substrate 1, for example a semiconductor wafer or a semiconductor layer structure or the like, a structural layer in which a movable part 2 is formed. In the movable part, which may be provided, for example, for an acceleration sensor, there are disposed etching apertures 4 for producing the spikes. Disposed on the surface of the substrate 1 are spikes 3 which are disposed in an offset manner laterally with respect to said etching apertures 4 or, generally, laterally narrowly bounded layer components which are preferably made of dielectric and which prevent the movable part 2 from being able to contact the surface of the substrate 1.

Figure 6:
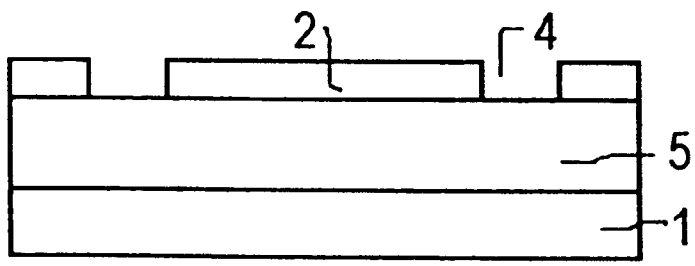
FIG. 6 is a side view of an intermediate product of the process of the present invention.
Figure 7:
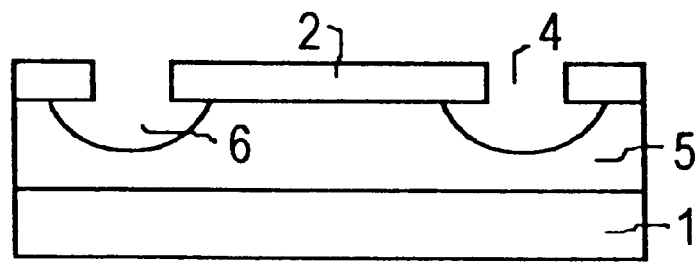
FIG. 7 is a side view of an intermediate product of the process of the present invention.
Figure 8:
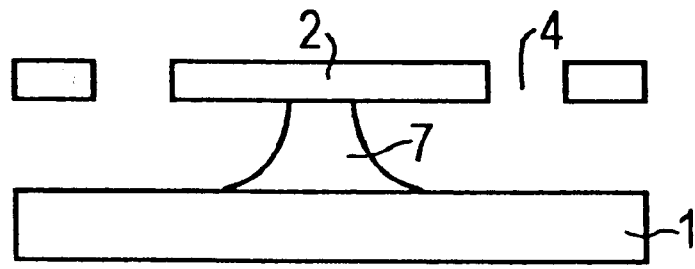
FIG. 8 is a side view of an intermediate product of the process of the present invention.
Figure 9:
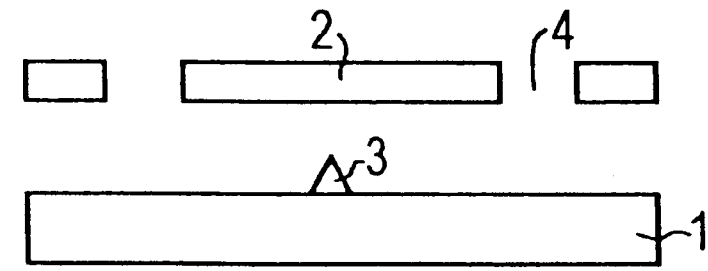
FIG. 9 is side view of a micromechanical component of the present invention made by the process of the present invention as illustrated in FIGS. 6–8.

The action of this structure and particularly advantageous production methods are described below by reference to FIGS. 6 to 11. FIGS. 6 shows in cross section a substrate 1, which may be, for example, a semiconductor wafer or a semiconductor layer structure or the like, on which auxiliary layer 5 (sacrificial layer) and a structure provided for the production of the movable part are applied one on top of the other. In said structure 2, apertures 4 provided as etching apertures for the subsequent method steps are produced, for example by the standard mask procedure. As shown in FIG. 7, the material of the auxiliary layer 5 is etched out through said etching apertures 4 so that the recesses 6 are produced in the auxiliary layer 5 underneath the structural layer 2 in the vicinity of the etching apertures 4. The auxiliary layer 5 is etched away to its full height, so that there is produced in the course of the etching process the structure which is shown in FIG. 8 and in which the structural layer 2 only rests on a residual component 7 of the auxiliary layer 5. By terminating the etching process at the correct time, the result is achieved that the movable part 2 formed in the structural layer is freed from the auxiliary layer 5, but a residual layer component 3 of the auxiliary layer 5 is left behind as a narrow spike on the substrate 1.

If the auxiliary layer 5 is produced from a dielectric material, for example an oxide, the spikes 3 produced simultaneously function as insulator between the substrate 1 and the movable part 2 so that electrodes can be disposed on the mutually oppositely situated surfaces without a short circuit having to be feared in the event of an unduly severe deflection of the movable part 2 during operation. After this structure has been produced, the movable part first adheres to the spikes. After drying the liquid still present on the surface of the substrate, however, the elastic restoring forces of the suspension of the movable part are already sufficient to separate said part from the spikes 3.

The spikes or raised sections which are provided as spacers and which are described in the claims uniformly as layer components may be disposed on the top side, adjacent to the movable part, of a substrate or of a layer structure which is fixed with respect the chip and on the movable part itself. The layer components may be made of metal, and an electrically insulating further layer or the like may be present between an electrode on the substrate provided for capacitive measurements and said layer components. An electrical contact between electrodes on the substrate and on the movable part can also be avoided as a result of the layer components functioning as spacers being present only at those spots where that surface of the movable part adjacent to the substrate or that surface of the substrate adjacent to the movable part has only dielectric material. The layer components can therefore be made in an electrically insulating manner of dielectric, which is preferably used, or of metal if, for example, higher mechanical stress makes harder layer components necessary.

The present invention can be implemented in planar micromechanical structures, but also in dome-shaped structures, for example in acceleration sensors which are used to detect rotational movements or the like. The spikes or layer components 3 can be of very low design, very shallow design or very pointed design. They may be as high as the spacing between the fixed surface and the movable part in the rest position in order to preclude completely, for example, a deflection of the movable part toward the substrate. In that case, it is only necessary to ensure that the movable part is sufficiently free-moving for the application purpose of the component in the plane of movement, that is to say parallel to the substrate surface in the example shown. The upper ends of the layer components 3 may be tapered or flattened or rounded. It is sufficient if said layer components are bounded laterally sufficiently narrowly so that the possible contact area between said layer components and the movable part is sufficiently small to avoid adherence.

It is expedient to produce the etching apertures 4 at the same time as patterning the structural layer 2 and subsequently to etch the auxiliary layer 5 by wet-chemical means, the material of the auxiliary layer 5 being chosen so that the auxiliary layer 5 can be etched selectively with respect to the material of the structural layer and to the material of the surface of the substrate 1. Examples of the arrangement of the etching apertures 4 are shown in FIGS. 10 and 11. The etching apertures are disposed at the points of a regular grid. Said grid forms a type of screen which can be displaced by a certain length in two different directions and is imaged in itself in the process. In this way, an arrangement of etching apertures is obtained in which, apart from the apertures at the periphery of the patterned movable part, each etching aperture is surrounded by the same number (larger than 2) of etching apertures which are at the minimum distance from these said etching apertures. In the example of FIG. 10, the screen is a square grid in which the etching apertures 4 are each surrounded by four adjacent apertures in directions which are mutually perpendicular. Given uniform thickness of the auxiliary layer 5 and equal size of the etching apertures 4, the circularly bounded etching region shown in FIG. 10 is produced for each etching aperture with a locally homogeneous etching rate. Through a suitable choice of etching time, the result is achieved that the region of the etching lies inside the circles 8 shown in FIG. 10. Of the auxiliary layer 5 etched out, a residual layer component 3 is left in the middle and forms the spike to be produced. Because of the sloping edges of the residual layer component produced during the etching, the resulting structure roughly resembles a pyramid with arched lateral faces.

In the arrangement of etching holes according to FIG. 11, the three etching apertures drawn form an equilateral triangle. This is therefore a hexagonal array or a mathematical grid in which the directions of the straight lines on which the adjacent grid points are disposed form angles of 60° with respect to one another. Every etching aperture which is not situated at the periphery is surrounded under these circumstances by six immediately adjacent etching apertures. Given a locally homogeneous etching rate and suitably chosen etching time, uniform thickness of the auxiliary layer 5 and equally large etching apertures result in turn in the etching regions shown in FIG. 11 as circles 8. In this case, a structure which resembles a tetrahedron with arched lateral faces is left as residual layer component 3 of the auxiliary layer 5. If the mutually immediately adjacent etching apertures 4 are differently aligned with respect to one another, layer components 3 which have, for example, a more elongated shape may be produced during etching. In the arrangement of FIG. 10, for example, the adjacent etching apertures in the horizontal direction of the drawing plane may be at a larger or smaller distance from one another than the adjacent etching apertures perpendicular to said direction. Very narrowly bounded spikes on all sides are obtained if, when viewed from the position of the spike, there are many etching openings present round about which are at the same distance from said spike if the movable part is brought to the position which it also assumed during the etching process, such as, for example, a rest position or a normal position. The etching apertures are generally preferably disposed at the corner points of regular polygons which do not overlap one another (overlap-free parqueting of the plane) so that roughly regularly and narrowly bounded spikes are obtained on all sides during etching. If said polygons are, in addition, part of a grid or array (complete parqueting with equal polygons), every etching aperture which is not disposed at the periphery of the movable part can serve at the same time for etching a plurality of spikes. However, it is possible in principle to adjust the number and arrangement of the etching apertures in a suitable way to the shape of the movable structure to be produced and the respective production conditions.

The layer components which serve as spacers can be formed particularly narrowly and pointedly by this method so that the structures present in the component according to the invention can be produced in such a way that sticking is permanently avoided. In addition, electrical insulation of the moveable structure from the remainder of the chip is achieved because of the possible use of a dielectric for said layer components.

From the above description, it is apparent that the objects and advantages of the present invention have been achieved. While only certain embodiments have been set forth, alternative embodiments and various modifications will be apparent from the above description to those skilled in the art. For example, the offsetting patterns of apertures disposed in the movable part or structural layer may be varied as well as the patterns of the spacer components. As shown in FIGS. 10 and 11, patterns other than square or triangular patterns may be provided such as pentagonal or sextagonal patterns and so forth. The materials comprising the substrate, movable part or structural layer, auxiliary layer and spacer components as well as the materials used for the masking operations may be varied and such variations will be apparent to those skilled in the art. These and other alternatives are considered equivalents and within the spirit and scope of the present invention.

What is claimed is:

1. A micromechanical component comprising:
    a substrate comprising a substrate surface and a movable part disposed a spaced distance from the substrate, the movable part comprising a movable part surface which opposes the substrate surface, the movable part being fabricated from a first material,
    the component further comprising a spacer disposed between the substrate surface and the movable part surface, the spacer being fabricated from a second material, the second material being different than the first material,
    the spacer preventing contact between the movable part and the substrate but permitting limited movement of the movable part towards the substrate,
    wherein the movable part comprises an aperture which extends through the movable part and the movable part surface and wherein the component further comprises at least two spacers, the aperture being disposed between the two spacers, at approximately equal distances between the two spacers.

2. The component of claim 1 wherein the spacer is connected to the substrate surface.

3. The component of claim 1 wherein the spacer is connected to the movable part surface.

4. The component of claim 1 wherein the spacer is conically shaped.

5. The component of claim 1 wherein the spacer is pyramidally shaped.

6. The component of claim 1 wherein the first material comprises a dielectric material and wherein the substrate surface and movable part surface are fabricated from a conducting material.

7. The component of claim 1 wherein the component comprises a sensor and wherein the movable part and the substrate comprise layers of the sensor.

8. The component of claim 1 further comprising a plurality of spacers.

9. A method manufacturing a micromechanical component comprising:
    providing a substrate, depositing an auxiliary layer on top of the substrate, depositing a structural layer with a plurality of apertures on top of the auxiliary layer, selectively removing most of the auxiliary layer through the apertures of the structural layer until small spacers are formed from remaining portions of the auxiliary layer, the spacers being disposed between at least two apertures.

10. The method of claim 9 wherein the structural layer is fabricated from a first material, the auxiliary layer is fabricated from a second material, the second material capable of being selectively removed without damage to the structural layer.

11. The method of claim 9 wherein the auxiliary layer is removed by etching whereby the apertures are used a etching apertures for removal of the auxiliary layer and etching material.

12. The method of claim 9 wherein the spacers are attached to the substrate.

13. The method of claim 9 wherein the spacers are attached to the structural layer.

14. A micromechanical component comprising:

a substrate and a movable part disposed a spaced distance from the substrate, the movable part comprising two apertures, the component further comprising at least one spacer disposed vertically between the substrate and the movable part and laterally between the two apertures, the spacer preventing contact between the movable part and the substrate but permitting limited movement of the movable part towards the substrate.

15. A method manufacturing a micromechanical component comprising:

providing a substrate, depositing a first material on top of the substrate to form an auxiliary layer, depositing a mask on top of the auxiliary material, the mask comprising a plurality of gaps, depositing a second material through the gaps of the mask to form a structural layer on top of the auxiliary layer, the mask defining a plurality of apertures in the structural layer, selectively removing the mask, selectively removing most of the auxiliary layer through the apertures of the structural layer and forming a small spacer from a remaining portion of the auxiliary layer, the spacer being disposed between the two apertures.

16. A micromechanical component comprising:

a substrate comprising a substrate surface and a movable part disposed a spaced distance from the substrate, the movable part comprising a movable part surface which opposes the substrate surface, the movable part being fabricated from a first material, the component further comprising a spacer disposed between the substrate surface and the movable part surface, the spacer being fabricated from a second material, the second material being different than the first material, the spacer preventing contact between the movable part and the substrate but permitting limited movement of the movable part towards the substrate, wherein the movable part comprises a plurality of apertures which extend through the movable part and the movable part surface and wherein the component further comprises a plurality of spacers, each of said apertures being disposed laterally and between at least two spacers, at approximately equal distances between said at least two spacers.

17. A micromechanical component comprising:

a substrate comprising a substrate surface and a movable part disposed a spaced distance from the substrate, the movable part comprising a movable part surface which opposes the substrate surface, the movable part being fabricated from a first material, the component further comprising a spacer disposed between the substrate surface and the movable part surface, the spacer being fabricated from a second material, the second material being different than the first material, the spacer preventing contact between the movable part and the substrate but permitting limited movement of the movable part towards the substrate, wherein the movable part comprises a plurality of apertures which extend through the movable part and the movable part surface and wherein the component further comprises a plurality of spacers, each of said apertures being disposed laterally and equidistantly between three spacers.

18. A micromechanical component comprising:

a substrate comprising a substrate surface and a movable part disposed a spaced distance from the substrate, the movable part comprising a movable part surface which opposes the substrate surface, the movable part being fabricated from a first material, the component further comprising a spacer disposed between the substrate surface and the movable part surface, the spacer being fabricated from a second material, the second material being different than the first material, the spacer preventing contact between the movable part and the substrate but permitting limited movement of the movable part towards the substrate, wherein the movable part comprises a plurality of apertures which extend through the movable part and the movable part surface and wherein the component further comprises a plurality of spacers, each of said apertures being disposed laterally and equidistantly between four spacers.

19. A micromechanical component comprising:

a substrate comprising a substrate surface and a movable part disposed a spaced distance from the substrate, the movable part comprising a movable part surface which opposes the substrate surface, the movable part being fabricated from a first material, the component further comprising a spacer disposed between the substrate surface and the movable part surface, the spacer being fabricated from a second material, the second material being different than the first material, the spacer preventing contact between the movable part and the substrate but permitting limited movement of the movable part towards the substrate, wherein the movable part comprises a plurality of apertures which extend through the movable part and the movable part surface and wherein the component further comprises a plurality of spacers, each of said apertures being disposed laterally and equidistantly between five spacers.

* * * * *